(12) United States Patent
Hou et al.

(10) Patent No.: US 6,294,409 B1
(45) Date of Patent: Sep. 25, 2001

(54) METHOD OF FORMING A CONSTRICTED-MOUTH DIMPLE STRUCTURE ON A LEADFRAME DIE PAD

(75) Inventors: Chih-Tsung Hou, Taichung Hsien; Kun Ming Huang, Changhwa, both of (TW)

(73) Assignee: Siliconware Precisionware Industries Co., Ltd. (TW)

( * ) Notice: Subject to any disclaimer, the term of this patent is extended or adjusted under 35 U.S.C. 154(b) by 0 days.

(21) Appl. No.: 09/491,723

(22) Filed: Jan. 27, 2000

(51) Int. Cl.[7] .......................... H01L 21/44; H01L 21/48; H01L 21/50

(52) U.S. Cl. .......................... 438/123; 438/106; 438/110; 438/121

(58) Field of Search ..................................... 438/106, 110, 438/111, 121, 123

(56) References Cited

U.S. PATENT DOCUMENTS 4,994,412 * 2/1991 Kalfus et al. .

5,367,191 11/1994 Ebihara .

* cited by examiner

*Primary Examiner*—Kevin M. Picardat
*Assistant Examiner*—D. M. Collins
(74) *Attorney, Agent, or Firm*—Peter F. Corless; Edwards & Angell, LLP

(57) ABSTRACT

A method is proposed for forming a constricted-mouth dimple structure on a lead-frame die pad for an integrated circuit (IC) package. This method can help secure the molded compound of the integrated circuit package more firmly in position to the die pad so that the molded compound would be less likely subjected to delamination. This method is charaterized in the use of a stamping process to punch on a selected part of the die pad that is located around the mouth of an originally-formed inwardly-tapered dimple structure, thereby narrowing the mouth of the inwardly-tapered dimple structure, resulting in the forming of the intended constricted-mouth dimple structure. Since this method requires only an additional stamping process to narrow the originally-formed inwardly-tapered dimple structure, it is much easier and more cost-effective to implement than the prior art.

5 Claims, 3 Drawing Sheets

METHOD OF FORMING A CONSTRICTED-MOUTH DIMPLE STRUCTURE ON A LEADFRAME DIE PAD

BACKGROUND OF THE INVENTION

1. Field of the Invention

This invention relates to integrated circuit (IC) packages, and more particularly, to a method of forming a constricted-mouth dimple structure on a die pad of a leadframe, which can help secure the molded compound of the integrated circuit package more securely to the die pad.

2. Description of Related Art

The integrated circuit packaging technology is used to pack an integrated circuit chip, which is typically very small in size, in a molded compound so that it can be easily mounted onto a printed circuit board. An integrated circuit package typically utilizes a leadframe having a die pad for mounting the integrated circuit chip, and a molded compound is formed to encapsulate the integrated circuit chip and the die pad.

FIG. 1 is a schematic sectional diagram showing the inside structure of a typical integrated circuit package, which includes a leadframe die pad 10, an integrated circuit chip 20 mounted on the die pad 10, and a molded compound 30 encapsulating the die pad 10 and the integrated circuit chip 20. To allow the molded compound 30 to be more firmly secured to the die pad 10, it is a common practice to form a plurality of dimples 11 on the back side of the die pad 10 for the purpose of increasing the contact area between the molded compound 30 and the die pad 10. This can help increase the bonding strength between the molded compound 30 and the die pad 10, making the molded compound 30 more firmly secured in position to the die pad 10.

Conventionally, these dimples 11 can be formed either by an etching process or a stamping process. These two processes would form the dimples into different shapes, as respectively depicted in the following with reference to FIGS. 2A–2B.

FIG. 2A is a schematic sectional diagram of a leadframe die pad 10 on which a plurality of dimples 11 are formed through an etching process. As shown, due to the nature of the etching process, these dimples 11 would be formed into a substantially semi-circular shape in cross section. FIG. 2B is a schematic sectional diagram of a leadframe die pad 10 on which a plurality of dimples 12 are formed through a stamping process. As shown, due to the nature of the stamping process, these dimples 12 would be formed into a substantially trapezoidal shape in cross section.

One common quality of the above-mentioned two types of dimples 11, 12 is that the width thereof becomes smaller from the mouth toward the inside, i.e., the mouth is the widest while the bottom is the narrowest in dimension (this kind of dimple structure is herein and hereinafter referred to as "inwardly-tapered dimple structure" throughout this specification).

One drawback to the inwardly-tapered dimple structure is that it would be unable to act as a anchor to the molded compound. In other words, when the molded compound is forcibly pulled, it would easily cause the molded compound to be drawn off the inwardly-tapered dimple structure, making the molded compound easily subject to delamination.

One solution to the foregoing problem is to form a plurality of slots in the die pad so as to catch the molded compound securely in position. One drawback to this solution, however, is that it would make the die-attachment process become more complex and thus difficult to carry out.

Another solution to the foregoing problem is disclosed in the U.S. Pat. No. 5,367,191 "LEADFRAME AND RESIN-SEALED SEMICONDUCTOR DEVICE". This patent utilizes two materials of different etching rates to form the die pad so that after an etching process is performed on the die pad, it can allow the resulted dimples to be formed with a constricted mouth (See FIG. 3 of the U.S. Pat. No. 5,367,191 Specification, for the part designated by the reference numeral 14). This kind of dimple structure is herein and hereinafter referred to as "constricted-mouth dimple structure" throughout this specification.

Due to the fact that a constricted-mouth dimple structure has a wide inside space and a constricted mouth, it can act as a anchor to the infilled part of the molded compound, thus preventing the molded compound from being pulled off the die pad, making the molded compound more firmly secured in position to the die pad.

One drawback to the forgoing patent, however, is that the use of two different materials of different etching rates to form the die pad would undesirably increase the material cost and make the overall manufacture process more complex to carry out. Still one drawback is that since the die pad has two different etching rates, the dimension control on the die pad would be difficult to carry out.

SUMMARY OF THE INVENTION

It is therefore an objective of this invention to provide a method for forming a constricted-mouth dimple structure on a leadframe die pad, which is easier and more cost-effective to carry out than the prior art.

In accordance with the foregoing and other objectives, the invention proposes a new method for forming a constricted-mouth dimple structure on a leadframe die pad. The method of the invention comprises the following steps: (1) performing an etching process or a stamping process to form an inwardly-tapered dimple structure at a predefined location on the die pad; and (2) performing a stamping process to punch on a selected part of the die pad that is located around the mouth of the inwardly-tapered dimple structure so as to cause the selected die-pad part to be squeezed radially inwards, effectively narrowing the mouth of the inwardly-tapered dimple structure, resulting in the forming of the intended constricted-mouth dimple structure.

Due to the fact that a constricted-mouth dimple structure has a wide inside space and a constricted mouth, it can act as a anchor to the infilled part of the molded compound, thus preventing the molded compound from being easily pulled off the die pad, making the molded compound more firmly secured in position to the die pad. Compared to the prior art, since the invention requires only an additional stamping process to narrow the originally-formed inwardly-tapered dimple structure, it allows the invention to be much easier and more cost-effective to implement than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, two preferred embodiments are disclosed in the following with reference to FIGS. 3A–3C and FIGS. 4A–4C.

Figure 1:
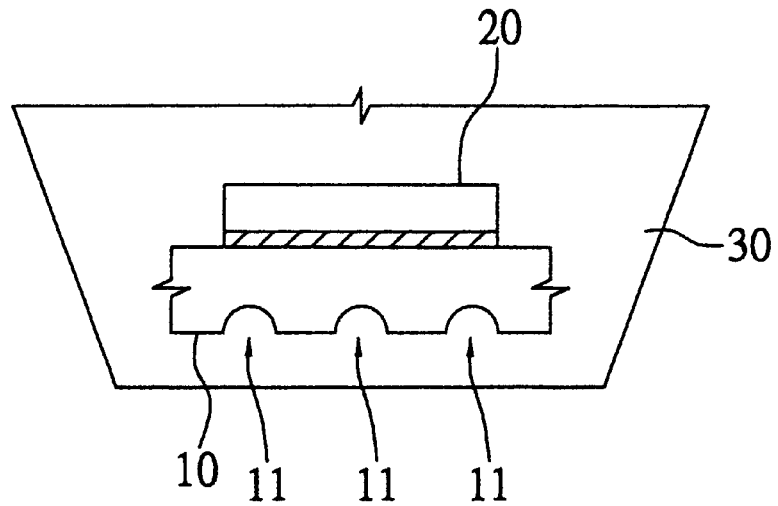
FIG. 1 (PRIOR ART) is a schematic sectional diagram showing the inside structure of a typical integrated circuit package.
Figure 2A:
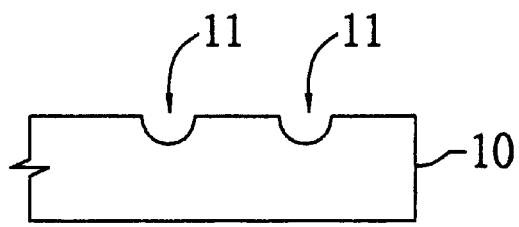
FIG. 2A (PRIOR ART) is a schematic sectional diagram of a leadframe die pad on a plurality of dimples are formed through an etching process.
Figure 2B:
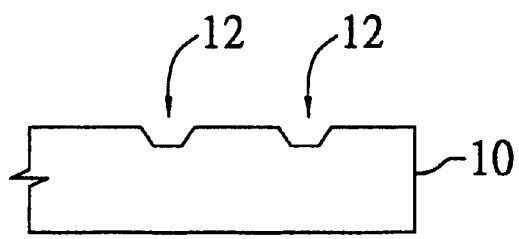
FIG. 2B (PRIOR ART) is a schematic sectional diagram of a leadframe die pad on which a plurality of dimples are formed through a stamping process.
Figure 3A:
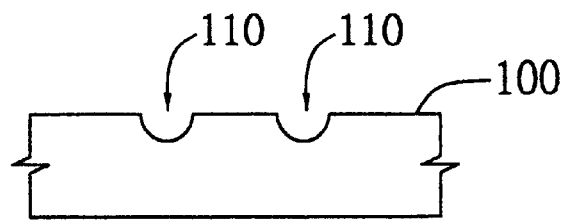
FIGS. 3A–3C are schematic sectional diagrams used to depict the first preferred embodiment of the invention.
Figure 3B:
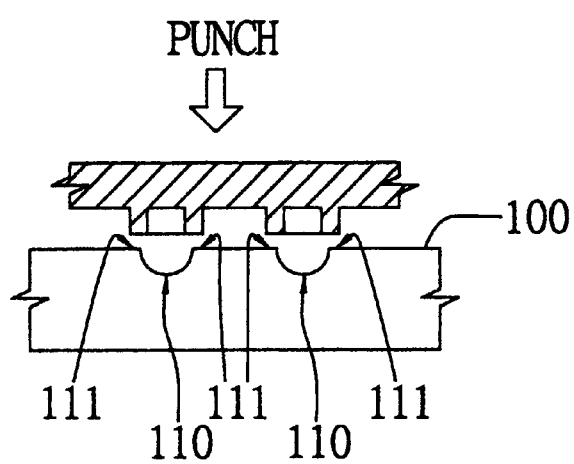
Figure 3C:
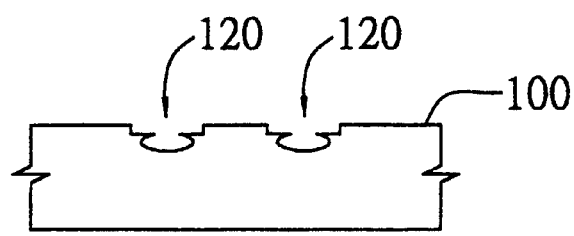

First Preferred Embodiment (FIGS. 3A–3C)

The first preferred embodiment of the invention is disclosed in full details in the following with reference to FIGS. 3A–3C.

Referring first to FIG. 3A, in the first step, a leadframe die pad 100 is prepared. Then, an etching process is performed to form a plurality of wide-mouth dimples 110 at predefined locations on the die pad 100. As mentioned earlier in the background section of this specification, the etching process would form these wide-mouth dimples 110 into a substantially semi-circular shape in cross section, referred to as an inwardly-tapered dimple structure.

Referring next to FIG. 3B, in the subsequent step, a stamping process is performed to punch on a selected part of the die pad 100 that is located around the wide-mouth dimples 110 (this selected part is pointed at by the reference numeral 111 in FIG. 3B) so as to cause this selected die-pad part 111 to be squeezed radially inwards.

Referring next to FIG. 3C, it can be seen that the stamping process would force the punched die-pad part 111 to be squeezed radially inwards, effectively narrowing the mouth of the wide-mouth dimples 110 (the resulted constricted-mouth dimple structure is here designated instead by the reference numeral 120).

Later during the compound-molding process, the resin can be filled into these constricted-mouth dimples 120 and, due to the fact that the constricted-mouth dimples 120 have a wide inside space and a constricted mouth, it can act as a anchor to the infilled resin, thus preventing the molded compound (not shown) from being easily pulled off the die pad 100.

Figure 4A:
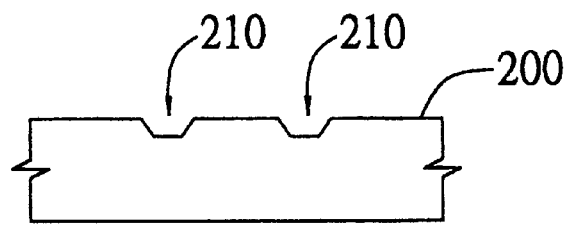
FIGS. 4A–4C are schematic sectional diagrams used to depict the second preferred embodiment of the invention.
Figure 4B:
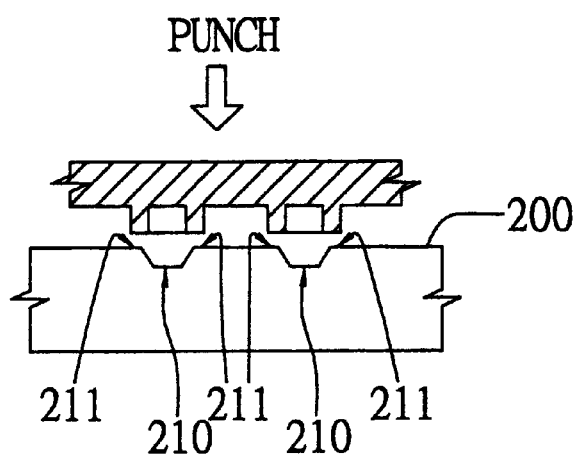
Figure 4C:
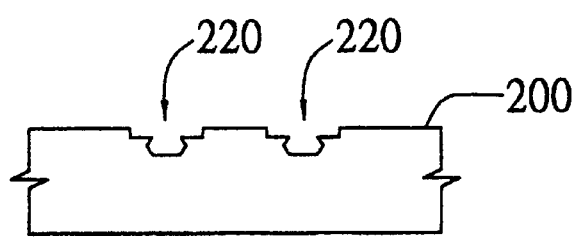

Second Preferred Embodiment (FIGS. 4A–4C)

The second preferred embodiment of the invention is disclosed in full details in the following with reference to FIGS. 4A–4C.

Referring first to FIG. 4A, in the first step, a leadframe die pad 200 is prepared. Then, a first stamping process is performed to form a plurality of wide-mouth dimples 210 at predefined locations on the die pad 200. As mentioned earlier in the background section of this specification, the stamping process would form these wide-mouth dimples 210 into a substantially trapezoidal shape in cross section, referred to as an inwardly-tapered dimple structure.

Referring next to FIG. 4B, in the subsequent step, a second stamping process is performed to punch on a selected part of the die pad 200 that is located around the wide-mouth dimples 210 (this selected die-pad part is pointed at by the reference numeral 211 in FIG. 4B) so as to cause this selected die-pad part 211 to be squeezed radially inwards.

Referring next to FIG. 4C, it can be seen that the second stamping process would force the punched die-pad part 211 to be squeezed radially inwards, effectively narrowing the mouth of the wide-mouth dimples 210 (the resulted constricted-mouth dimple structure is here designated instead by the reference numeral 220).

Later during the compound-molding process, the resin can be filled into these constricted-mouth dimples 220 and, due to the fact that these constricted-mouth dimples 220 have a wide inside space and a constricted mouth, it can act as an anchor to the infilled resin, thus preventing the molded compound (not shown) from being easily pulled off the die pad 200.

Conclusion

In conclusion, the invention proposes a new method for forming a constricted-mouth dimple structure on a leadframe die pad. Due to the fact that the constricted-mouth dimple structure has a wide inside space and a constricted mouth, it can act as a anchor to the infilled resin, thus preventing the molded compound from being easily pulled off the die pad, making the molded compound more firmly secured in position to the die pad. Compared to the prior art, since the invention requires only an additional stamping process to narrow the originally-formed inwardly-tapered dimple structure, the invention is much easier and more cost-effective to implement than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a constricted-mouth dimple structure on a leadframe die pad, comprising the steps of (1) forming an inwardly-tapered dimple structure at a predefined location on the die pad and (2) performing a stamping process to punch on a selected part of the die pad that is located around the mouth of the inwardly-tapered dimple structure so as to cause the selected die-pad part to be squeezed radially inwards, effectively narrowing the mouth of the inwardly-tapered dimple structure, resulting in the forming of the intended constricted-mouth dimple structure.

2. The method of claim 1, wherein in said step (1), an etching process is employed to form the inwardly-tapered dimple structure.

3. The method of claim 1, wherein in said step (1), a stamping process is employed to form the inwardly-tapered dimple structure.

4. A method for forming a constricted-mouth dimple structure on a leadframe die pad, comprising the steps of:

(1) performing an etching process to form an inwardly-tapered dimple structure at a predefined location on the die pad; and (2) performing a stamping process to punch on a selected part of the die pad that is located around the mouth of the inwardly-tapered dimple structure so as to cause the selected die-pad part to be squeezed radially inwards, effectively narrowing the mouth of the inwardly-tapered dimple structure, resulting in the forming of the intended constricted-mouth dimple structure.

5. A method for forming a constricted-mouth dimple structure on a leadframe die pad, comprising the steps of:

(1) performing a first stamping process to form an inwardly-tapered dimple structure at a predefined location on the die pad; and (2) performing a second stamping process to punch on a selected part of the die pad that is located around the mouth of the inwardly-tapered dimple structure so as to cause the selected die-pad part to be squeezed radially inwards, effectively narrowing the mouth of the inwardly-tapered dimple structure, resulting in the forming of the intended constricted-mouth dimple structure.

* * * * *

UNITED STATES PATENT AND TRADEMARK OFFICE
CERTIFICATE OF CORRECTION

PATENT NO.    : 6,294,409 B1  Page 1 of 1
DATED         : September 25, 2001
INVENTOR(S)   : C. Hou et al.

It is certified that error appears in the above-identified patent and that said Letters Patent is hereby corrected as shown below:

<u>Title page,</u>
Item [73], as herein indicated, "Assignee: Siliconware Precisionware Industries Co., Ltd. (TW)" should read -- Assignee: Siliconware Precision Industries Co., Ltd. (TW) --

Signed and Sealed this

Twenty-second Day of October, 2002

Attest:

Attesting Officer

JAMES E. ROGAN
*Director of the United States Patent and Trademark Office*